United States Patent [19]

Fichtner

[11] 4,150,415
[45] Apr. 17, 1979

[54] ENERGY CONSERVATION SYSTEM

[76] Inventor: Robert L. Fichtner, 1040 Shary Ct., Concord, Calif. 94518

[21] Appl. No.: 801,428

[22] Filed: May 31, 1977

Related U.S. Application Data

[63] Continuation-in-part of Ser. No. 701,533, Jul. 1, 1976, Pat. No. 4,037,114.

[51] Int. Cl.² .............................................. H01H 47/20
[52] U.S. Cl. ..................................... 361/182; 307/129; 307/140
[58] Field of Search ................ 361/182, 203; 307/129, 307/140

[56] References Cited

U.S. PATENT DOCUMENTS

| 3,590,271 | 6/1971 | Peters | 361/182 X |
| 3,873,894 | 3/1975 | Sato et al. | 361/182 |
| 4,037,141 | 7/1977 | Fichtner | 361/182 |

*Primary Examiner*—Harry E. Moose, Jr.
*Attorney, Agent, or Firm*—Phillips, Moore, Weissenberger, Lempio & Majestic

[57] ABSTRACT

An energy conservation system is disclosed wherein power in a given area, such as in a hotel or other room, is controlled by means of an ultrasonic sound transmitter and at least one or more ultrasonic sound receivers, each receiver controlling power for a separate power outlet. Upon entering the room, a key is inserted into a key receptacle to change the operating state of the transmitter, to thereby cause the receivers to couple power to the power outlets in the room. When the key is withdrawn from the key receptacle, the transmitter operating state is changed again, to cause the receivers to decouple power from their respective associated power outlets. The system can also incorporate temperature compensation means to control minimum or maximum temperatures in the area. The system can further accommodate intrusion, fire and occupancy detection signals as additional features.

20 Claims, 8 Drawing Figures

FIG_1

FIG_2

FIG_4

TONE GENERATOR

FIG-3

FIG_5

FIG_6

FIG_7

FIG_8

ENERGY CONSERVATION SYSTEM

CROSS-REFERENCE TO RELATED APPLICATION

This application is a continuation-in-part of copending application Ser. No. 701,533 filed July 1, 1976 and now U.S. Pat. No. 4,037,114.

BACKGROUND OF THE INVENTION

1. Field of the Invention

The present invention relates in general to energy conservation systems and more specifically to a system for controlling the coupling of power to a given area by means of a key-operated ultrasonic sound transmitter and one or more receivers associated therewith.

2. Description of the Prior Art

Prior art devices have used a radio receiver to remotely control the source of power for lighting. See, e.g., U.S. Pat. No. 2,346,889. Another prior art device enables remote control of power in a room, but its use is merely to enable different power outlets in the room to be controlled from a preexisting switch. See, e.g., U.S. Pat. No. 3,590,271 cited as being of interest in the above cited copending application. However, no prior art discloses control of power in a given room by means of a key-operated ultrasonic transmitter and one or more receivers in that room. Nor has there been found any prior art wherein the transmitter control may be overridden for example, to turn on a heater if the room temperature drops below a certain point. Such devices would have been impractical in the past due to their bulkiness and cost; factors that have ameliorated greatly with the advent of electronic integrated circuits.

The use of an ultrasonic sound signal versus a radio wave is also much more useful because a given ultrasonic sound transmitter has a localized output which will not turn on a receiver that is in another room; the sound waves are contained in the room by the walls which absorb the sound waves. No such limitation attaches to radio waves, so that for such a system, localization of a transmitter signal in a given room is much more expensive and difficult. Such localization is critically important in the operation of the present invention, for example, since one use of the system would be in hotel rooms where power in adjacent rooms would be controlled by separate independent systems according to the present invention.

SUMMARY OF THE INVENTION

The present invention is a system for controlling power use in a given room. A key must be placed in a key receptacle before power in the room is enabled. When the key is subsequently removed from the receptacle, power goes off again. Preferably, the same key used to gain access to the room, or a second key attached therewith, is required to be used in the key receptacle, so that when a user leaves the room and desires to lock the door behind him, he is forced to remove the key from the receptacle. He thereby disconnects power automatically from all power outlets in the room.

The system uses an ultrasonic sound transmitter and one or more ultrasonic receivers tuned to the output signal of the given transmitter. The transmitter can be in a normally on mode of operation while the room is occupied wherein the transmitter is activated by the insertion of the key into a key receptacle. The key closes a switch, which causes a tone signal, produced by a tone generator in the transmitter, to be coupled through an amplifier to an output speaker. The receivers in the room then detect the sound signal generated by the speaker. Each receiver amplifies this signal and feeds it to tone decoder means which determines whether or not the proper frequency tones have been received. If the correct tones are recognized, an output signal from the tone decoder means causes a power relay to turn on to thereby couple power to respective power outlets in the room. Subsequently, when the key is removed from the receptacle, the transmitter signals this condition to the receivers in the room in the same manner as described above, the receivers acting in response thereto to deenergize the power relay, thereby disconnecting power from the power outlet.

Of course, the transmitter can alternatively be in a normally off position when the room is occupied whereby the transmitter is activated by the removal of the key from the key receptacle. In this embodiment, the removal of the key closes the switch and, following the steps outlined above, ultimately causes the power relay to decouple power to the respective power outlets in the room.

In a further embodiment of the present invention, at least one thermostat means is included in either the transmitter or receiver wherein the decoupled power status of the power outlet can be overridden by the opening or closing of the thermostat. Accordingly, a minimum and maximum temperature range can be established in the room or other controlled area where the receiver-power outlet is located, for example, by means of the automatic coupling or decoupling of power from the associated receiver to an associated heater, air conditioner or combination type device.

In a still further embodiment of the present invention, the transmitter or receiver includes means to generate a signal indicating area occupancy.

Therefore, a primary object of the present invention is to control the power available in a given area by means of a key and key receptacle.

Another object of the present invention is to provide a system that requires a person to remove the key from a key receptacle, to thereby turn off the lights, T.V., etc. in the room, if that person wants to lock the room and take the key with him when he leaves.

A further object of the invention is to provide a system whereby the activating signal stays within a given room and does not affect systems in adjacent rooms.

Another object of the present invention is to provide a system for simply yet effectively enabling a person to turn on or off all power usage elements in a room at one time.

Another object of the present invention is to provide a system whereby no possibly damaging radio waves emanating from a transmitter in a given room are used, but instead much safer sound waves are used.

A further object of the present invention is to provide a simple means for adding an energy saving system to existing rooms without requiring any radical wiring changes therein.

A still further object of the present invention is to provide for minimum or maximum temperature control in a room or area when power has been decoupled to an air conditioner, heater or combination thereof in accordance with the invention.

Another object of the present invention is to provide for signaling that a given room or area is occupied when employing the present invention in the room.

Another object of the invention is to detect the presence of smoke or fire in a given room or area when employing the present invention in the room.

Other objects and advantages of the present invention will become more readily apparent upon reference to the accompanying drawings and following description.

DESCRIPTION OF THE PREFERRED EMBODIMENT

Figure 1:
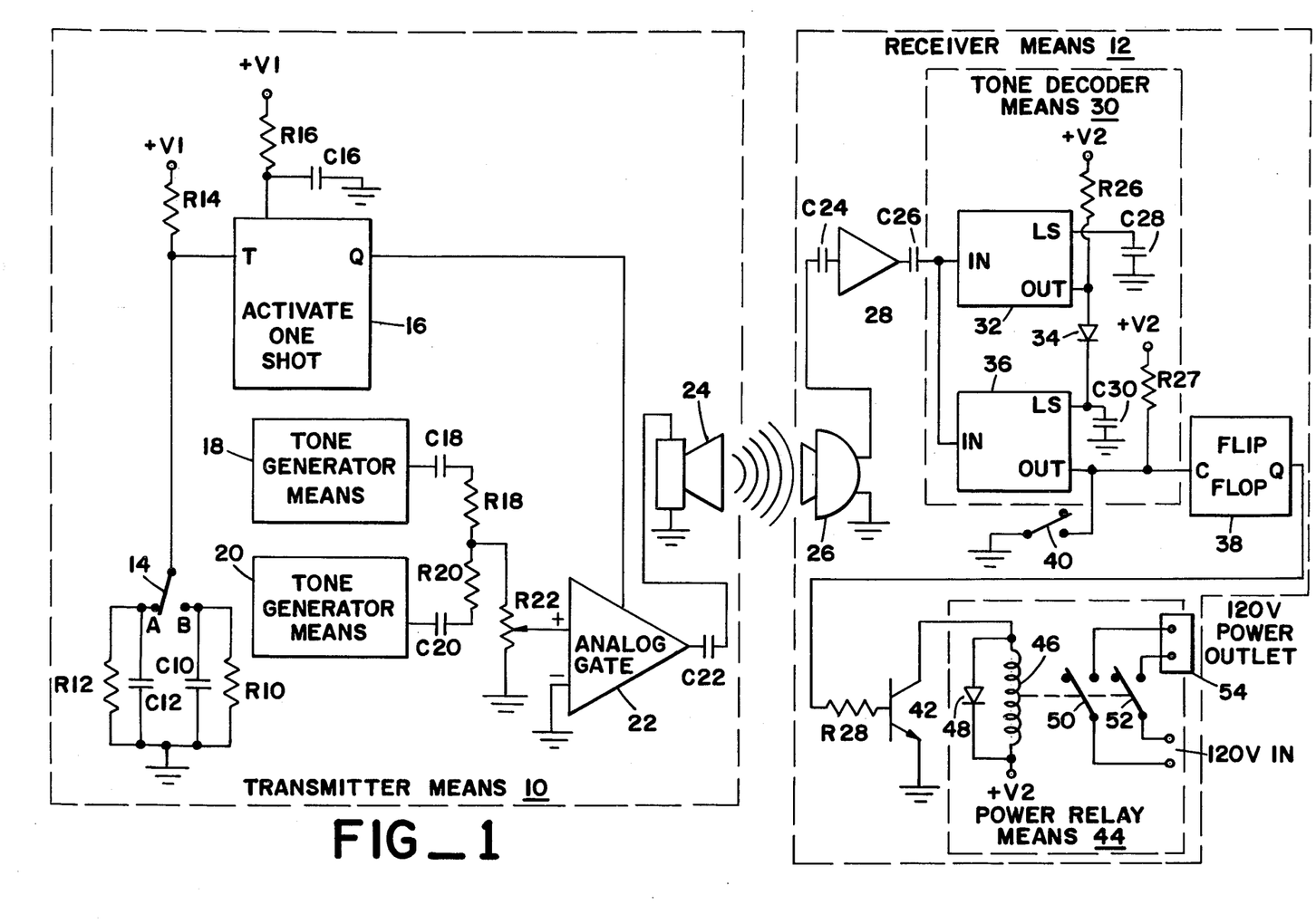
FIG. 1 is an electronic schematic, in block diagram form, illustrating the essential circuit components of both the ultrasonic transmitter and a representative receiver of the current invention.
Figure 3:
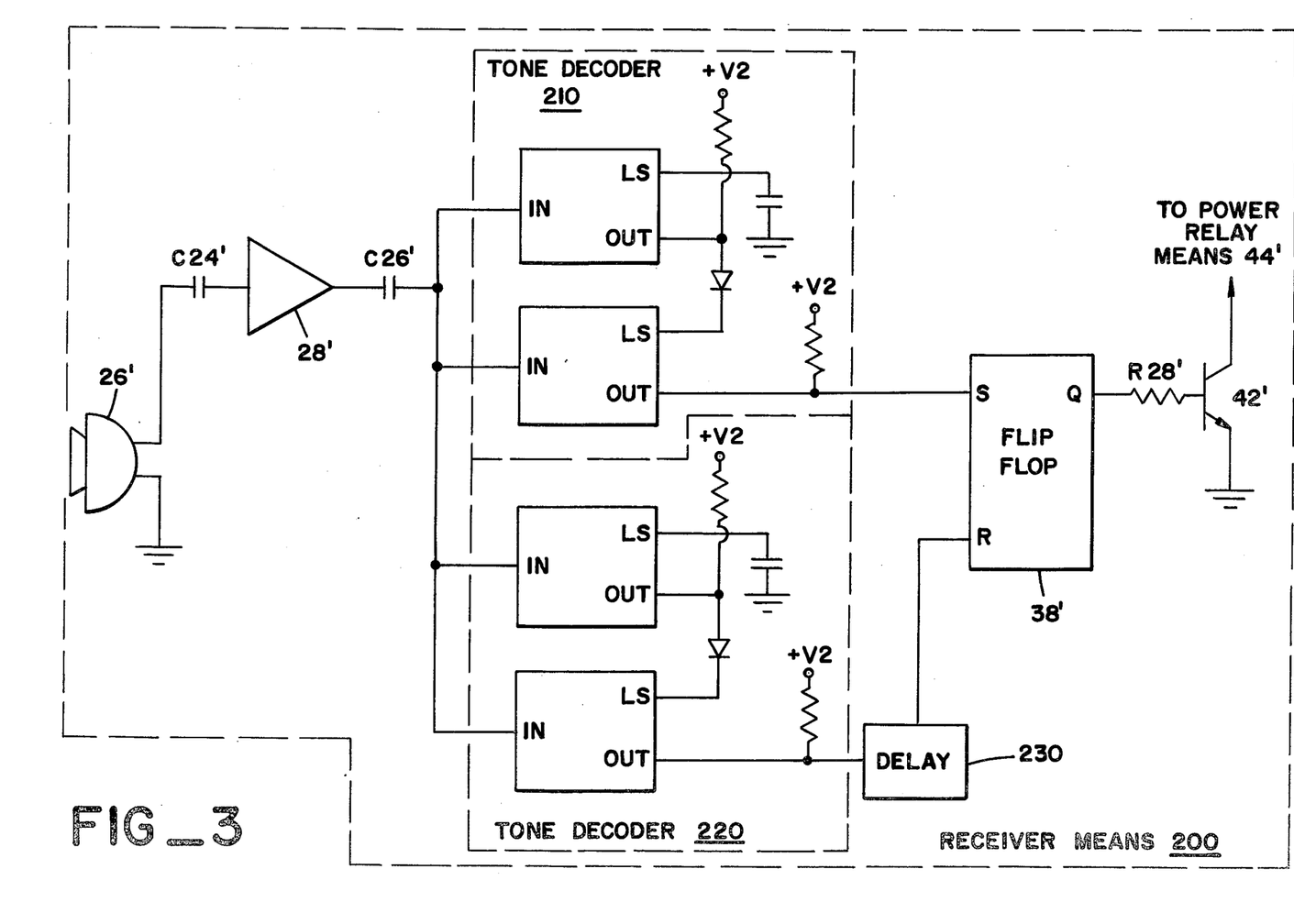
FIG. 3 is an electronic schematic, in block diagram form, of a second embodiment of the receiver means of the current invention.
Figure 4:
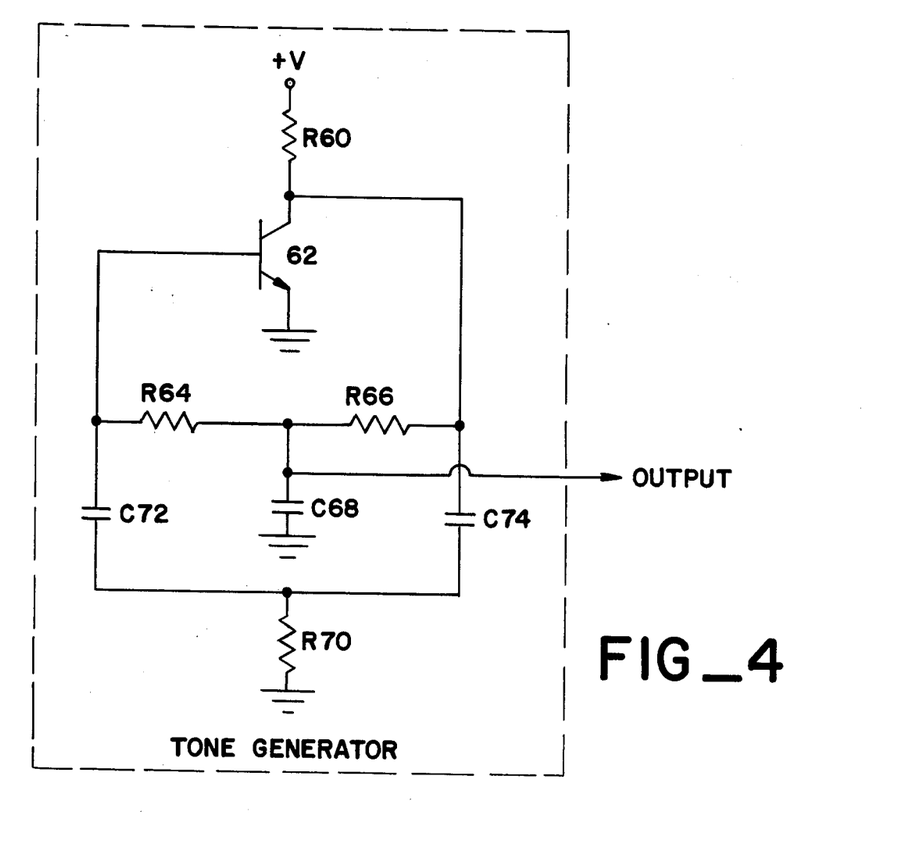
FIG. 4 is a detailed schematic of a representative tone generator of the current invention.
Figure 5:
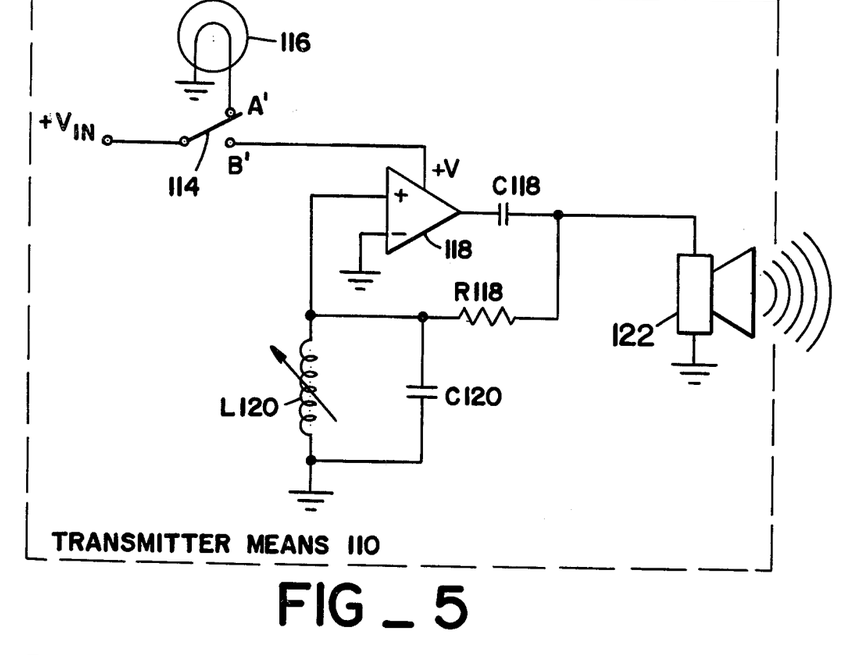
FIG. 5 is an electronic schematic, in block diagram form, of a second embodiment of the transmitter means of the current invention.

The energy conservation system according to the present invention is illustrated in one embodiment in FIG. 1 and in a second embodiment in FIG. 5. FIGS. 1-4 illustrate the embodiment of the transmitter-receiver combination wherein a multiple of frequency tones is employed. FIGS. 5-8 illustrate the use of a single tone transmitter and receiver combination. As discussed hereinafter, each of these embodiments of the present invention have certain advantages of cost, reliability and usefulness.

Figure 2:
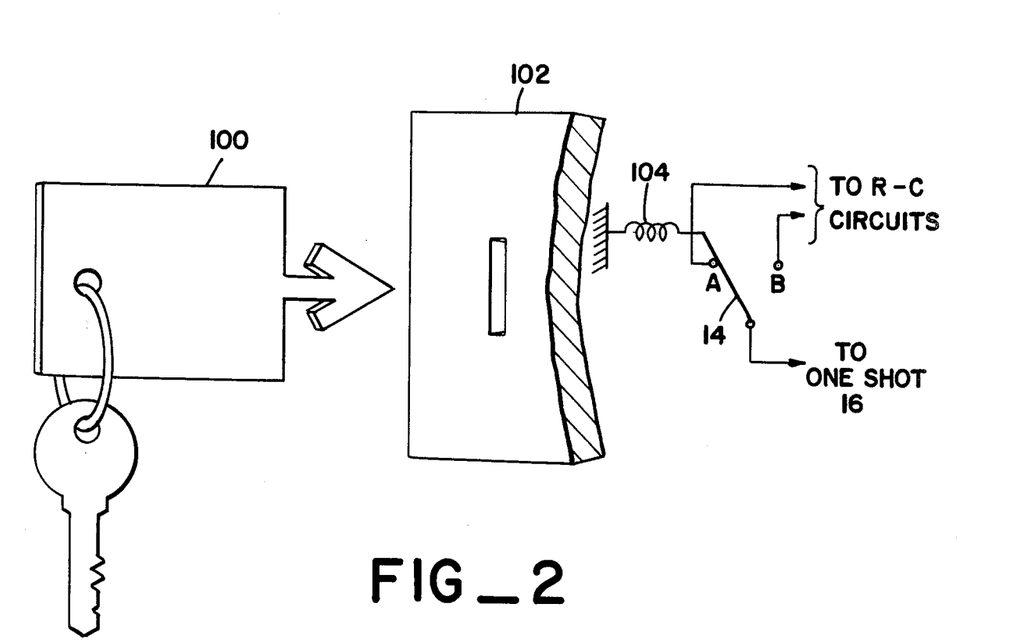
FIG. 2 is a schematic illustration of a key unit and key unit receptacle means for the current invention.

The embodiment shown in FIG. 1 includes an ultrasonic sound transmitter means 10 and a representative one of a plurality of ultrasonic sound receivers constituting a receiver means 12. The transmitter 10 is activated by a switch 14. As shown in FIG. 2, switch 14 is designed to change state in one direction, to pole B, when a key unit 100 is inserted into a key unit receptacle 102. The switch 14 is designed to change back in the other direction to its original state against pole A when the key unit 100 is removed from the receptacle. Thus, pole B would represent the activate or the power on state of the switch 14 and pole A would represent the deactivate or power off state of the switch 14.

Of course, switch 14 can be designed to have exactly the opposite effect; i.e., to change state in one direction, to pole B, when a key unit 100 is removed from key receptical 102. It would change back in the other direction to its original state against pole A when the key unit 100 is inserted into the receptacle 102. In this event, pole B would still represent the power on state of switch 14 and pole A the deactivate or power off state of switch 14.

Note that the key unit 100, receptacle 102, and the switch 14 can take on many different forms, e.g., they could comprise a standard key and key lock including a common switch means associated with the lock. An automobile ignition switch, for example, provides such a function. Many such ignition switches don't allows the key to be removed while the switch is on. It is within the state of the art to incorporate such a device as part of the current invention. Similarly, the switch 14 function could be obtained if the switch 14 had a spring biasing means 104 attached thereto, such that the switch 14 would always return to the power off or pole A state when the key unit 100 was removed or inserted as described above. Also, such a key lock could be designed such that the same combination key used to unlock the door to the room would be needed to "unlock" the key lock receptacle in that room, to activate the associated switch 14. Further, it is within the scope of the invention to use a coded card to which the room key is attached as the key unit 100. In this case, the key receptacle 102 would include a slot for accepting the coded card which could activate switch 14 as desired. The coded card, or a portion thereof, could also function as the contact arm of switch 14, or an insulating device to either activate or deactivate the switch as desired.

Referring again to FIG. 1, when one wants to activate the transmitter 10, switch 14 is switched to pole B. As is seen, this couples a formerly isolated R-C circuit R10, C10 to a pull up resistor R14 and to the trigger input T of an activate one shot 16. This R-C circuit causes the input T of one shot 16 to go to a low state and then begin to increase in voltage level back to its original state as a function of the charging rate of capacitor C10. The one shot 16 doesn't change state until capacitor C10 has had an opportunity to charge up to the trigger threshold voltage required to fire the one shot 16. When this threshold is reached, the one shot fires and generates an output pulse at its output line Q having a duration, as is commonly known in the art, which is a function of the time constant of the R-C circuit R16, C16 connected to the one shot 16. In the present embodiment, the one shot 16 is an NE555 one shot, R16 is a 5 megohm resistor, and C16 is a 0.47 microfarad capacitor. The function of the one shot 16 is to control an analog gate 22 which functions to allow the transmitter means 10 to output a sound signal only during the time the one shot 16 has fired and is on.

While the switch 14 is against pole B, the other R-C circuit R12, C12 functions initially to discharge capacitor C12 through resistor R12. When the switch 14 is thrown back to pole A, the capacitor C12 has no charge. Thus, it is caused to charge up, as C10 had done above, to thereby again activate the activate one shot 16. Therefore, the two R-C circuits C10, R10 and C12, R12 act to turn on one shot 16 whenever the switch 14 changes state. In the present embodiment C10 and C12 are 0.001 microfarad capacitors and R10 and R12 are 1 megohm resistors.

Two tone generators are shown at 18 and 20 in FIG. 1. One tone generator might be tuned, for example, to output a frequency tone of 40 kHz, with the other generator tuned to output a 30 kHz signal. Note that in the present embodiment, power is continuously supplied to the tone generators 18, 20 to prevent any warmup drift in the frequencies generated. The output frequency signals from these tone generators 18, 20 are bridged together through 1 megohm resistors R18 and R20 and through a variable resistor R22 to the non-inverting input of the analog gate 22. The capacitors C18 and C20 merely act as coupling capacitors for the signal from each tone generator to the analog gate 22 to ensure that no D C components of the signal are allowed to pass. The variable resistor R22 functions to provide a means for adjusting the signal strength output of the analog gate.

The output of the analog gate 22 reflects the output of the two tone generators 18, 20 as described above, when one shot 16 is on. This gate 22 output is coupled through a capacitor C22 to a speaker means 24. As a result, the resistor R22 functions to also control the signal strength of the sound signal that emanates from the speaker 24. In the present embodiment, the speaker means 24 is a common ultrasonic transducer.

FIG. 4 illustrates one example of a tone generator circuit that is utilizable with the present invention. This tone generator circuit consists of a "twin T" oscillator that uses a low pass network R64, R66, and C68 and a high pass network R70, C72 and C74. As the phase shifts are opposite for each network, there is only one frequency at which the phase shift is 180° between the collector and base of transistor 62. This gives feedback supportive of oscillation at this frequency. R60 is merely a 3.3 kilohm biasing resistor for the transistor 62.

An output signal from the transmitter means 10 made up of two separate frequency tones has certain advantages, the main one being that if only one tone were used, there would be greater noise sensitivity. Short bursts of high frequency audio noise are not uncommon. Note however, that a similar result could be obtained by using two tone generators of the same frequency, but wherein one generator produces an output shifted in phase from the output of the other generator. The alternate embodiment of the present invention, as described below and illustrated in FIG. 4 on, includes a one tone transmitter. A delay e.g. three seconds built into each receiver greatly reduces the noise sensitivety such that it is comparable to the described two tone system.

The receiver means 12 also is illustrated in FIG. 1. Each receiver 12 includes a microphone means 26 whose output is amplified by an input amplifier means 28. The output of this unit is fed into tone decoder means 30. If the proper tones are detected by the decoder 30, it outputs a signal to a flip-flop 38 which acts in response thereto to either turn on or turn off a power relay means 44 and thereby couple or decouple a 120 volt AC power line to the power outlet means 54.

Specifically, a standard crystal microphone 26 is used to detect the audio signals outputted by the transmitter means 10. The output of this microphone 26 is fed through a coupling capacitor C24 to an input amplifier means 28. The present embodiment uses an FET biased as an amplifier, and such amplifiers are well known in the art. The amplifier 28 amplifies the signal detected by the microphone 26, and feeds the amplified signal output through a coupling capacitor C26 to the tone decoder means 30. The tone decoder means 30 comprises a plurality of standard phase locked loop circuits, one each for every tone to be detected by the receiver means 12. In the present embodiment, since two tones are used, two phase lock loop circuits (PLL's) 32, 36 are used. As is seen in FIG. 1 the output of the amplifier 28 is fed into each of these PLL's 32, 36. Note that each PLL 32, 36 requires a tone having a sufficient duration to allow it to lock on to the tone. As a result, the PLL's 32, 36 thereby also act as a filter to protect the system from erroneously activating. Further, each PLL 32, 36 acts to lock on only to tones having a frequency within a set bandwidth of their capture frequency.

To insure that the tone decoder means 30 only provides an output when both tones are detected, the output of PLL 32 is fed into the PLL 36 such that only when the proper tone is detected by the PLL 32 is the PLL 36 enabled to lock in on its proper tone. The output line of the PLL 32 is held high by a pull up resistor R26 until its proper tone is detected. At this point, the line goes low, thereby reverse biasing diode 34 and causing the last stage (LS) line of the PLL 36 to activate. The LS line for both the PLL's 32, 36 has a capacitor C28 and C30 respectively connected to it to act as a low pass filter for the output stage of the PLL. When the PLL 32 has not detected the proper frequency tone, the diode 34 is forward biased to thereby lock off the last stage of the PLL 36.

Thus, when both PLL's 32 and 36 have detected their proper tone, the out line of PLL 36 goes low, since this line normally is held high by the pull up resistor R27. This output feeds the clock input of a flip flop 38. As a result, when the PLL 36 detects its tone, it goes low for the duration of the tone signal. When the tone frequency audio input to the receiver 12 ends, to thereby turn off this PLL 36 signal, the rising edge of this pulse enables the flip flop 38 to change state. Note that when the receiver 12 is first turned on, there must be a means for initializing this flip flop 38 so that it is in the proper state for turning on and turning off the power to the power outlet means. If this were not provided, the insertion of a key unit 100 into a receptacle 102 could act to turn off the lights instead of the desired turning on of the lights in a given room. Therefore, a simple switch 40 is added to the clock input of the flip flop 38 so that if the flip flop 38 is in the wrong state when power to the receiver means 12 is initially turned on, merely by toggling this switch momentarily, one will produce the desired clock pulse for reversing the flip flop 38's state.

The Q output of flip flop 38 is coupled to a relay driver circuit and thereby to the power relay means 44. This driver circuit comprises a resistor R28 and a transistor 42 connected in a conventional manner. The collector of the transistor 42 is connected to the coil 46 of the power relay means 44 so that when the flip flop 38 is on, the transistor 42 conducts, to thereby energize the coil 46 and turn on the power relay means 44. The diode 48 is added merely to prevent unwanted current spikes when the coil is turned off again. Thus, when the flip flop 38 is energized, the 120 volts AC that is connected to switches 50 and 52 is caused to be coupled through these switches to the 120 volt power outlet means 54. Subsequently, when flip flop 38 changes state again, the transistor 42 discontinues conducting. This de-energizes the coil 46, causing the switches 50, 52 to return to their normally closed state, to thereby cut off power to the power outlet means 54.

Since each receiver 12 comprises only one relay, a few integrated circuits, and some other small components, it can be seen that the entire unit can be installed right at a given power outlet means. Thus, in a given room, any number of such receivers can be installed at the user's option wherever any power is used, e.g. to control the coupling of power to one or more lights, to a T.V., or to any other power usage elements in the room. Also, the transmitter 10 is easily installable in that usually in a given room there is a light switch near the door. The transmitter 10 of the present invention is designed such that it can be installed in place of the normal room light switch. Therefore, the present invention is easily installable in any room, such that one can optionally control any or all power outlets, i.e. power use elements, therein.

As mentioned above, this first embodiment of the present invention uses a transmitter having two tone generators. The output of these generators is gated out in tone bursts to either activate or deactivate the receivers in a given room, depending on the state of the flip flop 38. In other words, the same tone burst is generated by the transmitter 10 when the key 100 is inserted into the receptacle 102 as when it is removed from the receptacle. Besides the noise sensitivity aspect noted previously, the tone generator scheme just described has been designed also for cost considerations.

It is further within the scope of the present invention to use two sets of two tone generators, wherein one set of tone generators is used to turn on the power outlet relay means via a receiver 12, and a second set of tone generators is used to turn off the power outlet relay means. The receiver of such an apparatus is illustrated in FIG. 3 and described in more detail herein below. A four tone generator transmitter similar to the transmitter 10 is not disclosed, however, because it is considered to be obvious to a person skilled in the art to add a second one shot and switch means similar to one shot 16 and switch 14 and a second set of tone generators and analog gate means as was described above for the transmitter 10, such that a four tone transmitter 10 is created thereby.

Referring now to FIG. 3, the audio signal received by a four tone decoder receiver means 200 is initially handled similarly to the above described receiver 12. A microphone 26 detects the audio signal which is then coupled through a capacitor C24' to an input amplifier 28'. The output of this amplifier is coupled through a coupling capacitor C26' to the tone decoder means. In this embodiment, however, the tone decoder means comprises two separate tone decoders, tone decoder 210 and tone decoder 220. Tone decoder 210 operates similarly to the tone decoder 30 in receiver 12. When a key 100 is inserted into the receptacle, a tone burst is transmitted by a transmitter. This tone burst is made up of two tones, such tones being decodable by the decoder 210. When a tone burst is detected, the decoder 210 outputs a signal to the set input of flip flop 38' to cause the Q output of this flip flop 38' to go on. Since decoder 220 does not see the two tones in the tone burst that it is tuned for, it remains idle. As in receiver 12, when the Q output of the flip flop 38' goes on, a power relay means 44' thereby becomes actuated to couple power to a power outlet means 44' (not shown in FIG. 3). Now, however, when the key 100 is removed from the receptacle 102, a different tone burst is transmitted by the transmitter. In this case, decoder 220 is activated and decoder 210 remains idle. The output of decoder 220 is coupled to the reset input of flip flop 38' to cause it to reset and thereby deactivate the power relay means 44'. Note that a delay 230 could be added by a person skilled in the art, between the decoder 220 and the flip flop 38' to provide a short delay, 5 seconds for example, to enable whoever is deactivating the power in a given room to leave the room before the power usage elements, such as the lights, in fact go off.

Figure 6:
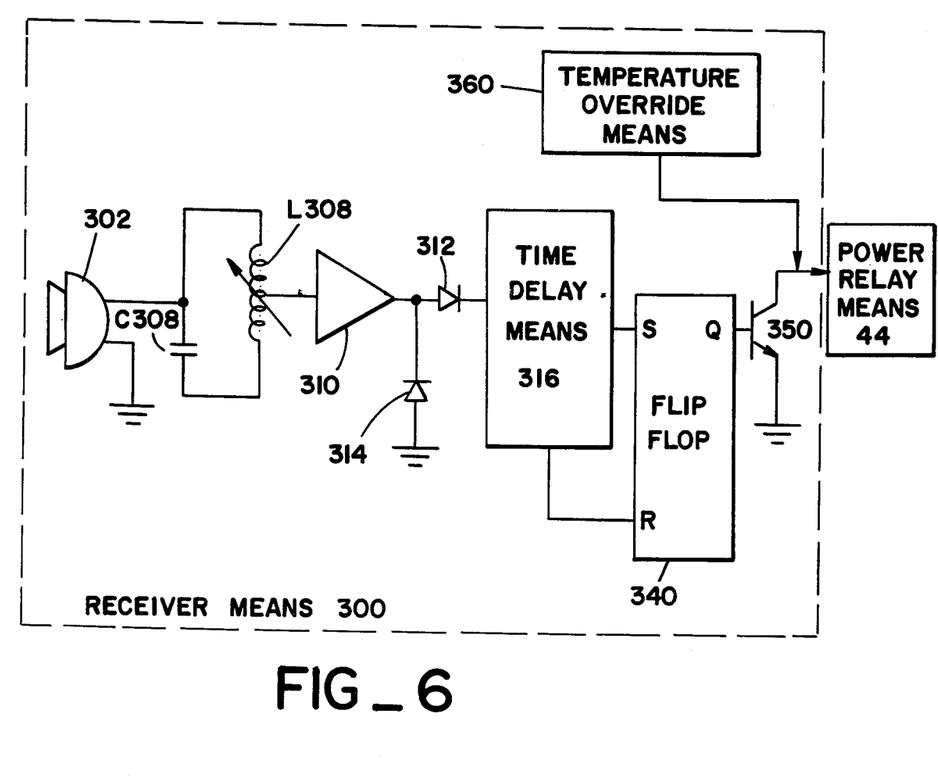
FIG. 6 is an electronic schematic, in block diagram form, of a third embodiment of the receiver means of the current invention.

A further preferred embodiment of the present invention is shown in FIGS. 5 and 6. In this embodiment, a continuous ultrasonic tone output is utilized as opposed to a tone burst as described above with reference to FIGS. 1-4.

Referring to FIG. 5, the transmitter means 110 comprises a single pole switch 114 which activates the transmitter upon removal or insertion of key 100 into key receptical 102 as explained previously. In this embodiment of the invention, the transmitter is switched on when the key is removed from the key receptacle. Switch 114 is similar in design to switch 14 described previously, in that it is designed to automatically return from pole B' to pole A' when the key is removed from the receptacle.

Attached to pole A' of switch 114 may be an indicator means such as lamp 116 as shown. Thus when key 100 is inserted into receptacle 102, switch 114 contacts pole A' allowing a conducting path to lamp 116 to result, and further causing amplifier/oscillator 118 to be disabled. Lamp 116 would be preferably located at a central control station remote from the area or room being controlled by the present invention. For example, in hotels where the system controls an individual hotel room, the indicator means can be located on the hotel switchboard or registration desk to indicate that a room is unoccupied when the lamp is off or occupied when the lamp is on.

It is well known that most multiple dwelling buildings such as hotels or motels, for example, contain a message indication system for each unit or room. Although different types are in commercial practice, all of these systems employ a wired system from the central control point to the room using separate wires or wires which are a part of the telephone system. As is well known in the art, a signal can be imposed on these wires without disrupting their original design function to activate a light such as light 116 on the central control panel. Thus, the present invention can incorporate this feature without the attendant high costs or routing wires to the control location.

Referring once again to FIG. 5, when the key 100 is removed from the receptacle 102, switch 114 contacts pole B' allowing power to be coupled to amplifier/oscillator 118. This is a conventional operational amplifier biased such that the non-inverting input of the amplifier is receiving a feedback signal through feedback resistor R118 and an L-C circuit. Consequently, the amplifier output oscillates at a frequency set by the L-C circuit. The L-C circuit comprises an adjustable core inductor L120 and its associated capacitor C120. The output of the amplifier/oscillator 118 is coupled, via a coupling capacitor C118, to speaker 122. Adjustment of adjustable core inductor L120 enables easy variation of the frequency output of the amplifier/oscillator 118 and hence the output of speaker 122. In the present embodiment, the amplifier/oscillator is a LM 384 power amplifier. C118 is a 1 microfarad capacitor, R118 is a 1 megohm resistor, and in the L-C circuit, C120 is a 0.1 microfarad capacitor and the adjustable core inductor L120 is variable from 0.9 to 1.1 millihenry.

A representative matched receiver means 300 for transmitter means 110 is illustrated in FIG. 6. The receiver 300 comprises six main stages and an optional temperature override stage. These stages comprise a microphone means 302, an L-C tuned circuit means comprising an adjustable core inductor L308 and a capacitor C308, a pre-amplifier means 310, a time delay means 316, flip flop 340, a relay driver means 350 and the temperature override means 360.

The ultrasonic signal transmitted by transmitter 110 is detected by microphone 302 and coupled to the L-C tuned circuit of inductor L308 and capacitor C308. This tuned circuit and the natural resonance of microphone 302 determines what signal frequency is detected, the combination thereof being tuned to the frequency emitted by the transmitter 110. The adjustable core inductor L308 also transforms the high impedance signal of microphone 302 to a low impedance signal required for the preamplifier means 310. The preamplifier means 310 merely amplifies the received signal. Diodes 312 and 314 rectify the amplified signal to D C. The rectified signal is then coupled to the time delay means 316.

The time delay means provides both receiver "on" and "off" delays. As described hereinabove, when the room or area is entered, transmitter 110 is in an operating mode, and power to each controlled device (air conditioner, heater, TV, lamp, etc.) is disabled via their associated receiver and power relay. When the key is inserted into the key receptacle, the transmitter is disabled and the receiver no longer receives the signal at microphone 302. However, it is necessary to prevent false triggering of the controlled device to a power "on" condition due to momentary signal loss. Moreover, when the occupant removes the key from the key receptacle to leave the room, an instantaneous power off condition of the controlled devices could darken the room completely. Consequently, it is preferred to delay the going off of the controlled device until the individual has had a sufficient amount of time to exit the room or area.

Figure 7:
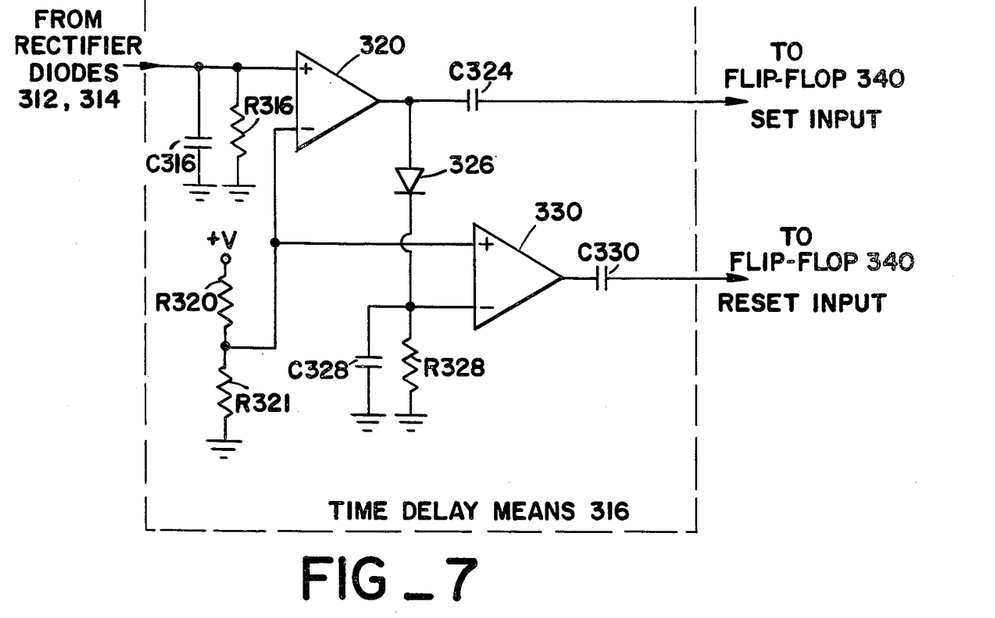
FIG. 7 is an electronic schematic, in block diagram form, of a representative time delay of the current invention.

These functions are accomplished by time delay means 316, a representative circuit thereof being depicted in FIG. 7. The time delay means 316 comprises a dual voltage comparator in two stages, stage one, shown at 320, and stage two, shown at 330. The controlled device "on" delay is accomplished via the R-C time constant of capacitor C316 and resistor R316 and the associated comparator 320. The device "off" delay is accomplished via the R-C time constant of capacitor C328 and resistor R328 and the associated comparator 330.

In operation, comparator 320 compares the incoming signal level from preamplifier means 310 with the threshold voltage level as set by two resistors, R320 and R321. When transmitter means 110 is operating, the signal level at the inverting input of comparator 320 is high, resulting in a low at the output. Upon insertion of the key in the key receptacle, disabling transmitter 110, signal loss will be detected by receiver 300. Signal loss will thus occur at the preamplifier stage 310 output. Since C316 is in a charged state, it will discharge slowly through Resistor R316. The time of C316 discharge, for example 3 seconds, will delay turn on of comparator 320 and thereby device "on" activation. If the disruption is momentary, the signal will be restored at the preamplifier output, and false triggering of the device "on" is prevented. As capacitor C316 discharges, the voltage at the inverting input of comparator 320 slowly drops until, after the time delay as set by R316, C316, the input becomes lower than the threshold level at the comparator 320 non-inverting input. As a result, the output of comparator 320 rapidly changes from low to high. This output signal is coupled to the set input of flip flop 340, via coupling capacitor C324, thereby causing the flip flop 340 to change state. As described below, this causes power to be coupled to the device being controlled by the given receiver 300. Note that it is also within the scope of the present invention to cause power to be decoupled from a controlled device via a receiver 300 when a key 100 is inserted in a key receptacle 102. Such a function would be needed, for example, if certain types of burglar alarm systems were used in the room.

The output of comparator 320 is also coupled through a diode 326 to the inverting input of comparator 330. When the output of comparator 320 goes low upon the removal of the key 100 from key receptacle 102, enabling thereby the activation of transmitter means 110, C328 slowly discharges through R328. At the end of this discharge time, the inverting input of comparator 330 will fall below the same threshold level as set by resistors R320 and R321 which are also connected to the non-inverting input of comparator 330. As a result, the output of this comparator is caused to go high. The output of comparator 330 is fed to the reset input of flip flop 340 via coupling capacitor C330, to cause this flip flop to reset. Thus, power to the controlled device is caused to be turned off. Preferably the discharge rate of R328, C328 is at least 30 seconds, but may be as long as several minutes if desired. As mentioned above, this "off" delay is to enable persons to leave the room after the key 100 has been removed from receptacle 102 before the lights, for example, go off.

Referring again to FIG. 6 the output of flip flop 340 is coupled to a relay driver means 350. When the output of flip flop 340 is high, driver means 350 is enabled, and a signal is transmitted to the coil of the power relay means 44 to switchably couple power to the device, as described for a previous embodiment herein. When the output of flip flop 340 is low driver means 350 is disabled, causing the relay means 44 to go off and power to the device decoupled via the relay 44 contacts.

In this embodiment of receiver means 300, the microphone 302 is a conventional piezo-electric transducer, C308 is a 0.1 microfarad capacitor, L308 is a 0.9 to 1.1 millihenry adjustable core inductor, and preamplifier means 310 comprises two series connected MC3310 amplifiers with associated filtering and bias circuitry well known in the art. Diodes 312, and 314 and 326 are IN914 diodes, and in the time delay means, each of the comparators 320, 330 are contained in an LM 339 device. Capacitor C316 is 1 microfarad, R316, R320, and R321 are 3.3 megohm, 100 kilo-ohm, and 27 kilo-ohm respectively. Capacitor C324 is 0.02 microfarads and capacitor C330 is 0.001 microfarads. Resistor 328 is 5 megohm and C328 is 4.7 microfarads. Flip flop 340 is composed of two conventional NOR gates, and relay driver means 350 comprises two series connected transistors, 2N2222A and 2N2905S.

A further preferred embodiment of the invention includes the use of a temperature override means as part of the present invention when power to the heating, air conditioning or combination thereof devices in the area or room is controlled by the receiver means. This feature is desirable to prevent the room under control from becoming too hot or too cold as a result of ambient weather conditions when not occupied for long periods of time. As shown in FIG. 6, temperature override means 360 in a receiver means 300 can provide a signal to turn on relay driver means 350, independent of the state of transmitter 110. Consequently, the coil of the normally closed power relay 44 is activated, and thus power is coupled to the heater or air conditioner systems allowing these devices to turn on when room temperature has exceeded tolerable limits. High and low temperature actuation points can be externally adjustable or internally preset. Of course, it is also possible to independently control the operative state of the transmitter means 110 in a similar manner. Note that the system could also be configured to normally allow the heater or air conditioner to remain on even with no one in the room. In this case, the override means would cause the air conditioner to be automatically turned off if room temperature dropped below 65° F., for example, and similarly cause the heater to be turned off if room temperature exceeded 80° F.

Figure 8:
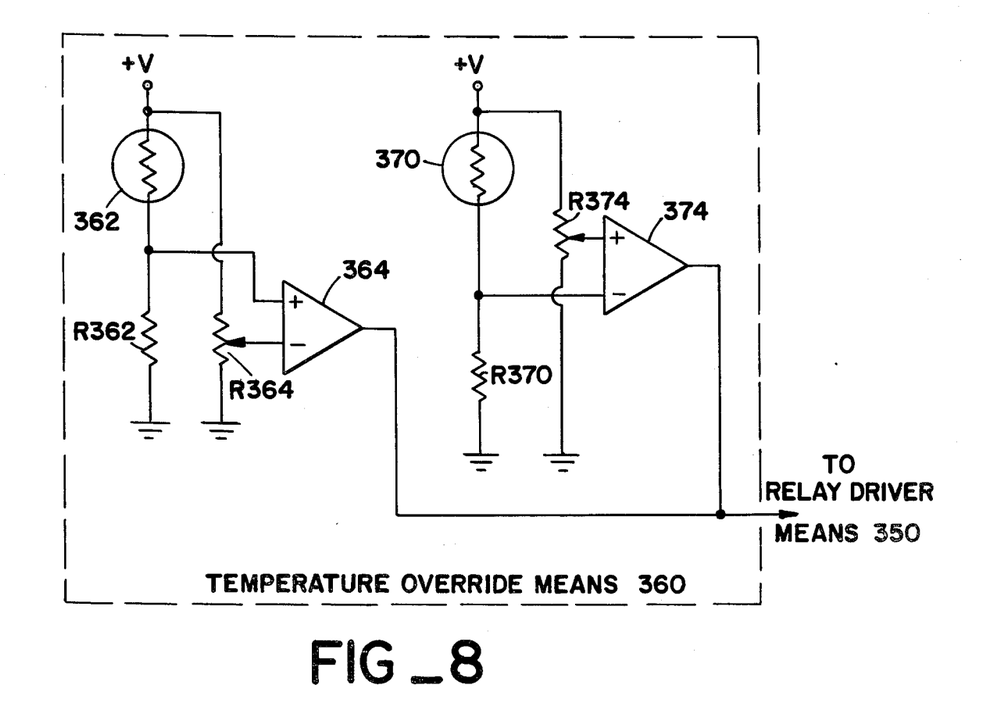
FIG. 8 is an electronic schematic, in block diagram form, of a representative temperature override or compensation circuit of the current invention.

FIG. 8 of the drawing depicts a preferred means of providing temperature overriding. This circuit employs thermistors 362 and 370 in combination with resistors R362, R370 in respective voltage divider networks to provide a voltage to an associated comparator that is proportional to the temperature detected by the thermistor. Potentiometers R364 and R374 provide an adjustable reference voltage level for each of the comparators 364 and 367. The potentiometers are therefore used to adjust the threshold of temperature detection. In this example, the thermistor 362 circuit is set to turn on at 65° F. and the thermistor 370 circuit is set to turn on at 80° F.

In the operation, as the temperature in the room drops, the resistance of thermistor 362 increases. Since it is part of a voltage divider network with R362, the voltage at their junction decreases. When this voltage drops below the threshold voltage set by R364, comparator 362 will turn on. This signal turns on relay driver means 350, thus enabling turning on of the heating system.

Thermistor 370, R370, comparator 374 and variable resistor R374 function in the same manner, only inverted. Accordingly, when the temperature rises above 80° F., the power relay means 44 goes on thus enabling turning on of an air conditioner system. It is within the scope of the present invention to use a time delay network, similar to one discussed hereinabove, to maintain comparators 364, 374 in an "on" condition for a minimum period of time to prevent rapid "on-off" cycling of the heater or air conditioning systems.

As discussed previously herein, it is preferred that the receiver be located in a package which is installed right at the given power outlet means. However, many heater-air conditioner type systems have power outlets which are located under the system. In this event it is preferred to install the power relay means 44 at the power outlet, and install the receiver integrated circuits and microphone remote from the power outlet of the heating and cooling system. Thus, the receiver microphone 302 is preferably located in a line of site position to the transmitter speaker.

In some cases, hotels or motels use a central heating and air conditioning system wherein entry of heated or cooled circulated air is controlled by a thermostat-fan combination which meters entry of the air into the room or area. In this event it is within the scope of the invention that the signal output of the receiver means would control the thermostat-fan combination control in the room instead of a power outlet. Therefore, in this application the power relay means would control the power input to the fan control or thermostat of the system, thus normally disabling the same when the key 100 is removed from the key receptacle 102. The temperature override would act to selectively control power to such a unit as a function of room temperature. Accordingly, throughout the specification and claims, the term "power outlet means" includes a conventional power outlet receptacle as well as the power source input to a device such as the room fan control or thermostat.

Reasonable modifications of the above described invention will be apparent to those skilled in the art from a reading of this disclosure, the drawings and the claims. For example it is also within the scope of the present invention to use a continuous-pulsed ultrasonic transmitter to accomplish signal generation, wherein the matched receiver employs a counter network to discriminate not only the proper frequency but also the pulse rate to activate the receiver.

I claim:
1. An energy conservation system comprising:
   ultrasonic sound transmitter means;
   a key unit;
   a key receptacle arranged to receive said key unit and including means for indicating a key inserted state and a key removed state, said sound transmitter means acting in response to one of said indicated states to output a sound signal having at least one frequency tone therein;
   power outlet means; and
   ultrasonic sound receiver means including means for controlling the coupling of power to said power outlet means as a function of said output sound signal of said transmitter means.
2. The system of claim 1 wherein said ultrasonic sound transmitter means outputs said sound signal in response to the indication by the key receptacle of said key removed state.
3. The system of claim 1 wherein said ultrasonic transmitter means outputs said sound signal in response to the indication by the key receptacle of a key inserted state, said receiver means acting in response thereto to couple power to said power outlet means.
4. The system of claim 3 wherein the output sound signal is a plurality of frequency tones.
5. The system of claim 2 wherein said ultrasonic transmitter means outputs no sound signal when said key receptacle indicates a key inserted state, said receiver means acting in response thereto to couple power to said power outlet means.
6. The system of claim 5 wherein the output sound signal is a single frequency tone.
7. The system of claim 1 further including a temperature sensing and overriding means, said temperature sensing means outputting a temperature signal when the temperature reaches a predetermined value, said system acting in response to said temperature signal to cause power to be coupled to said power outlet means when said system is in the state wherein the power has been decoupled to said power outlet means, thereby overriding said system state.
8. The system of claim 1 further including an occupancy detection means, said detection means outputting a signal in response to one of said indicated states.
9. The system of claim 8 wherein said occupancy detection means further includes an indicator means located at a location remote from said transmitter means or receiver means which is activated by the output signal of said occupancy detection means.
10. The system of claim 5 wherein said transmitter comprises:
    a tone generator means;
    speaker means; and
    means for amplifying the output tone of said tone generator means such that said tone activates said speaker means upon removal of said key unit from said key receptacle.

11. The system of claim 5 wherein said receiver means further comprises:
   microphone means for detecting the sound signal produced by said transmitter means and to output a signal in response thereto;
   tone decoder means for receiving the signal from said microphone means and for determining whether said signal is the output tone from said transmitter means, and to output a signal in response thereto if said tone is detected;
   preamplifier means for amplifying the output signal from said tone decoder means;
   rectifier means for generating a DC signal from said amplified output signal; and
   time delay means for delaying the deactivation of said means for controlling the coupling of power to said power outlet means in response to the removal of said key unit from the key unit receptacle.

12. The system of claim 11 wherein said time delay means further includes means for delaying the activation of said means for controlling the coupling of power to said power outlet means in response to the insertion of said key into said key unit receptacle.

13. The system of claim 11 wherein said means for controlling the coupling of power to said power outlet means comprises:
   a flip flop for changing state in response to said DC signal as delayed by said time delay means and to output a signal in response thereto;
   relay driver means to amplify said flip flop signal and to output a relay driver signal therefrom; and
   power relay means acting in response to said relay driver signal from said relay driver means to switchably couple power to said power outlet means when said flip flop is in one state and acting to switchably decouple power from said power outlet means when said flip flop is in its other state.

14. The system of claim 13 wherein said power outlet means comprises the power input to a combination fan control-thermostat means which controls the entry of circulated air from a central heating/air conditioning system into the area in the vicinity of the receiver and transmitter means.

15. An energy conservation system for controlling power in a given area or room comprising:
   a key unit;
   a key unit receptacle;
   a power source;
   power outlet means in said given area or room;
   an ultrasonic transmitter including at least one tone generator and including speaker means;
   switch means, said switch means changing state when said key unit is removed from said key unit receptacle to cause said transmitter to output a tone signal; and
   at least one ultrasonic receiver means connected between said power source and at least one power outlet means in said room or area, said receiver means including a microphone means, tone decoder means biased to detect the tone signal of said transmitter, a preamplifier means, a rectifier means, a time delay means, a flip flop means, relay driver means, and a power relay, said power relay acting to switchably enable power to be coupled to said power outlet means in response to the state of said flip flop means as coupled to said relay by said relay driver means, said microphone being arranged to detect the tone signal emanating from said speaker means and to output a signal in response thereto, said tone decoder means detecting the output signal of said microphone means, determining whether said signal is the output tone signal from said transmitter means, and outputting a signal in response thereto if said tone signal is detected, said preamplifier means amplifying the output signal of said tone decoder means, said rectifier means generating a DC signal from said amplified output signal, said time delay means outputting said DC signal after a determinate period of time after receipt of the signal from said rectifier means to said flip flop, said flip flop changing state in response to said time delayed signal to deactivate said relay driver means, said relay driver means ceasing to output a signal to said power relay means to thereby deactivate the same and decouple said power source from said power outlet means.

16. The apparatus of claim 15 wherein said receiver means further comprises a temperature override means including a thermostat means set to activate when the temperature in the given room or area reaches a predetermined value and to output a signal in response thereto, said signal acting to activate said relay driver means, said power relay means acting in response thereto to activate and to couple said power source to the power outlet means.

17. The apparatus of claim 16 wherein said transmitter further includes an occupancy detection means including an indicator means located remote from the vicinity of said given room or area and connected to said switch means such that when said key unit is removed from said key receptacle said switch means changes state and activates said indicator means.

18. A method of saving energy comprising the steps of:
   (a) detecting the absence of a key unit from a key unit receptacle;
   (b) generating in response thereto ultrasonic sound waves having at least one frequency component;
   (c) detecting the specific frequency component or components of said generated ultrasonic sound waves; and
   (d) causing power to be decoupled from a power outlet means in response to said detection.

19. The method of claim 18 further comprising the steps of:
   (e) detecting the insertion of said key unit into said key unit receptacle;
   (f) eliminating in response thereto the generation of said ultrasonic sound waves;
   (g) detecting the absence of said ultrasonic sound waves; and
   (h) causing in response thereto power to be coupled to said power outlet means.

20. The method of claim 18 further comprising the steps of:
   (e) detecting the insertion of said key unit into said key receptacle,
   (f) generating in response thereto ultrasonic sound waves having at least one frequency component, said frequency component or components being of a different frequency than that generated upon the removal of said key from said key receptacle.
   (g) detecting the specific frequency component or components of the generated ultrasonic sound waves,
   (h) causing power to be coupled to said power outlet means in response to said detection.

* * * * *